United States Patent [19]
Steinmann et al.

[11] Patent Number: 5,972,563
[45] Date of Patent: Oct. 26, 1999

[54] LIQUID, RADIATION-CURABLE COMPOSITION, ESPECIALLY FOR STEREOLITHOGRAPHY

[75] Inventors: Bettina Steinmann, Praroman; Adrian Schulthess, Tentlingen, both of Switzerland

[73] Assignee: Ciba Specialty Chemicals Corp., Tarrytown, N.Y.

[21] Appl. No.: 08/901,303

[22] Filed: Jul. 28, 1997

[51] Int. Cl.⁶ .............................. G03F 7/028; G03F 7/26
[52] U.S. Cl. .................. 430/280.1; 430/269; 522/170; 522/92; 522/96; 522/15; 522/25; 264/401
[58] Field of Search .................. 430/269, 280.1; 522/170, 92, 96, 15, 25; 264/401

[56] References Cited

U.S. PATENT DOCUMENTS

| | | | |
|---|---|---|---|
| 3,708,296 | 1/1973 | Schlesinger | 96/33 |
| 4,091,223 | 5/1978 | Zussman et al. | 548/308 |
| 4,156,035 | 5/1979 | Tsao et al. | 427/44 |
| 4,339,567 | 7/1982 | Green et al. | 528/102 |
| 4,383,025 | 5/1983 | Green et al. | 430/280 |
| 4,398,014 | 8/1983 | Green et al. | 528/89 |
| 4,599,401 | 7/1986 | Koleske | 528/408 |
| 4,624,912 | 11/1986 | Zweifel et al. | 430/258 |
| 4,751,102 | 6/1988 | Adair et al. | 427/53.1 |
| 4,772,530 | 9/1988 | Gottschalk et al. | 430/138 |
| 4,772,541 | 9/1988 | Gottschalk et al. | 430/339 |
| 4,818,776 | 4/1989 | Koleske | 522/31 |
| 4,868,288 | 9/1989 | Moier | 534/15 |
| 4,874,798 | 10/1989 | Koleske et al. | 522/31 |
| 5,476,748 | 12/1995 | Steinmann | 430/269 |
| 5,605,941 | 2/1997 | Steinmann et al. | 522/170 |
| 5,665,494 | 9/1997 | Kawabata et al. | 430/2 |
| 5,665,792 | 9/1997 | Lawton et al. | 522/31 |
| 5,707,780 | 1/1998 | Lawton et al. | 430/280.1 |

FOREIGN PATENT DOCUMENTS

| | | |
|---|---|---|
| 1300307 | 5/1992 | Canada . |
| 0035969 | 9/1981 | European Pat. Off. . |
| 0044274 | 1/1982 | European Pat. Off. . |
| 0054509 | 6/1982 | European Pat. Off. . |
| 0094914 | 11/1983 | European Pat. Off. . |
| 0094915 | 11/1983 | European Pat. Off. . |
| 0153904 | 9/1985 | European Pat. Off. . |
| 0164314 | 12/1985 | European Pat. Off. . |
| 0223587 | 5/1987 | European Pat. Off. . |
| 0509512 | 10/1992 | European Pat. Off. . |
| 0605361 | 7/1994 | European Pat. Off. . |
| 0646580 | 4/1995 | European Pat. Off. . |

OTHER PUBLICATIONS

RN: 54735–63–6, Registry File on STN Service, American Chemical Society, 1999.

P. Jacobs, Rapid Prototyping & Manufacturing, Fundamentals of Stereolithography, Soc. of Manufact. Engineers, 1992, pp. 256–258, (No Month).

P. Jacobs, Rapid Prototyping & Manufacturing, Fundamentals of Stereolithography, Soc. of Manufact. Engineers, 1992, pp. 156–163, (No Month).

*Primary Examiner*—Cynthia Hamilton
*Attorney, Agent, or Firm*—Michele A. Kovaleski

[57] ABSTRACT

A liquid, radiation-curable composition which in addition to a liquid, free-radically polymerizable component comprises at least the following additional components: (A) from 40 to 80 percent by weight of a liquid difunctional or more highly functional epoxy resin or of a liquid mixture consisting of difunctional or more highly functional epoxy resins; (B) from 0.1 to 10 percent by weight of a cationic photoinitiator or of a mixture of cationic photoinitiators; and (C) from 0.1 to 10 percent by weight of a free-radical photoinitiator or of a mixture of free-radical photoinitiators; and (D) up to 40 percent by weight of a hydroxy compound, in which composition component (D) is selected from the group consisting of:

(D1) phenolic compounds having at least 2 hydroxyl groups, (D2) phenolic compounds having at least 2 hydroxyl groups, which are reacted with ethylene oxide, proplyene oxide or with ethylene oxide and propylene oxide, (D3) aliphatic hydroxy compounds having not more than 80 carbon atoms, (D4) compounds having at least one hydroxyl group and at least one epoxide group, and (D5) a mixture of at least 2 of the compounds mentioned under (D1) to (D4), and component (D) is present in the compositions in a quantity of at least 2 percent by weight; the free-radically polymerizable component comprises at least (E) from 4 to 30 percent by weight of at least one liquid poly(meth)acrylate having a (meth)acrylate functionality of more than 2; and at least one of components (A) and (D) comprises substances which have aromatic carbon rings in their molecule, is particularly suitable for stereolithography, a particular feature of this composition being that it leads to cured material which exhibits only a very low propensity for uptake of water.

13 Claims, No Drawings

LIQUID, RADIATION-CURABLE COMPOSITION, ESPECIALLY FOR STEREOLITHOGRAPHY

The present invention relates to a liquid, radiation-curable composition which is particularly suitable for the production of three-dimensional shaped articles by means of stereolithography, to a process for the production of a cured product and, in particular, for the stereolithographic production of a three-dimensional shaped article from this composition.

The production of three-dimensional articles of complex shape by means of stereolithography has been known for a relatively long time. In this technique the desired shaped article is built up from a liquid, radiation-curable composition with the aid of a recurring, alternating sequence of two steps (a) and (b); in step (a), a layer of the liquid, radiation-curable composition, one boundary of which is the surface of the composition, is cured with the aid of appropriate radiation, generally radiation produced by a preferably computer-controlled laser source, within a surface region which corresponds to the desired cross-sectional area of the shaped article to be formed, at the height of this layer, and in step (b) the cured layer is covered with a new layer of the liquid, radiation-curable composition, and the sequence of steps (a) and (b) is repeated until a so-called green model of the desired shape is finished. This green model is, in general, not yet fully cured and must therefore, normally, be subjected to post-curing.

The mechanical strength of the green model (modulus of elasticity, fracture strength), also referred to as green strength, constitutes an important property of the green model and is determined essentially by the nature of the stereolithographic-resin composition employed. Other important properties of a stereolithographic-resin composition include a high sensitivity for the radiation employed in the course of curing and a minimum curl factor, permitting high shape definition of the green model. In addition, for example, the precured material layers should be readily wettable by the liquid stereolithographic-resin composition, and of course not only the green model but also the ultimately cured shaped article should have optimum mechanical properties.

Liquid, radiation-curable compositions for stereolithography which meet the abovementioned requirements are described, for example, in EP-A-0 605 361. These compositions are so-called hybrid systems, comprising free-radically and cationically photopolymerizable components. In addition to the liquid, free-radically polymerizable component, these compositions comprise at least:

(A) from 40 to 80 percent by weight of a liquid difunctional or more highly functional epoxy resin or of a liquid mixture consisting of difunctional or more highly functional epoxy resins;
(B) from 0.1 to 10 percent by weight of a cationic photoinitiator or of a mixture of cationic photoinitiators; and
(C) from 0.1 to 10 percent by weight of a free-radical photoinitiator or of a mixture of free-radical photoinitiators; and
(D) up to 40 percent by weight of a certain hydroxy compound.

This hydroxy component (D) is selected from the group consisting of OH—terminated polyethers, polyesters and polyurethanes and is present in the compositions in a quantity of at least 5 percent by weight; the free-radically polymerizable component of said compositions additionally comprises the following constituents:

(E) from 0 to 15 percent by weight of at least one liquid poly(meth)acrylate having a (meth)acrylate functionality of more than 2, and
(F) from 5 to 40 percent by weight of at least one liquid cycloaliphatic or aromatic diacrylate, the content of component (E) being not more than 50 percent by weight of the entire (meth)acrylate content.

These stereolithographic-resin compositions, however, lead to shaped articles which still exhibit a relatively high water uptake, which is undesirable in many cases. One object of the present invention, therefore, is to improve these hybrid systems such that the water uptake of a shaped article produced using them is decreased. At the same time, the other properties important for stereolithography, for example the properties already mentioned above, should at least substantially be retained.

In accordance with the invention this object is achieved by the provision of a liquid, radiation-curable composition comprising in addition to a liquid, free-radically polymerizable component at least the following additional components:

(A) from 40 to 80 percent by weight of a liquid difunctional or more highly functional epoxy resin or of a liquid mixture consisting of difunctional or more highly functional epoxy resins;
(B) from 0.1 to 10 percent by weight of a cationic photoinitiator or of a mixture of cationic photoinitiators; and
(C) from 0.1 to 10 percent by weight of a free-radical photoinitiator or of a mixture of free-radical photoinitiators; and, in addition to the abovementioned components,
(D) up to 40 percent by weight of a hydroxy compound, in which composition component (D) is selected from the group consisting of:
  (D1) phenolic compounds having at least 2 hydroxyl groups,
  (D2) phenolic compounds having at least 2 hydroxyl groups, which are reacted with ethylene oxide, proplyene oxide or with ethylene oxide and propylene oxide,
  (D3) aliphatic hydroxy compounds having not more than 80 carbon atoms,
  (D4) compounds having at least one hydroxyl group and at least one epoxide group, and
  (D5) a mixture of at least 2 of the compounds mentioned under (D1) to (D4), and component (D) is present in the compositions in a quantity of at least 2 percent by weight; the free-radically polymerizable component comprises at least
(E) from 4 to 30 percent by weight of at least one liquid poly(meth)acrylate having a (meth)acrylate functionality of more than 2; and at least one of components (A) and (D) comprises substances which have aromatic carbon rings in their molecule.

As an optional additional component, the novel composition may additionally, in particular, comprise (F) one or more di(meth)acrylates, preferably in a quantity of from 5 to 40 percent by weight.

The epoxy resins which may be used in the novel compositions are expediently resins which are liquid at room temperature and which on average possess more than one epoxide group (oxirane ring) in the molecule. Such resins may have an aliphatic, aromatic, cycloaliphatic, araliphatic or heterocyclic structure; they contain epoxide groups as side groups, or these groups form part of an alicyclic or heterocyclic ring system. Epoxy resins of these types are known in general terms and are commercially available.

Polyglycidyl esters and poly($\beta$-methylglycidyl) esters are one example of suitable epoxy resins. They are obtainable by reacting a compound having at least two carboxyl groups in the molecule with epichlorohydrin or glycerol dichlorohydrin or β-methylepichlorohydrin. The reaction is expediently carried out in the presence of bases. The compounds having at least two carboxyl groups in the molecule can in this case be, for example, aliphatic polycarboxylic acids, such as glutaric acid, adipic acid, pimelic acid, suberic acid, azelaic acid, sebacic acid or dimerized or trimerized linoleic acid. Likewise, however, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids such as, for example, phthalic acid, isophthalic acid, trimellitic acid or pyromellitic acid, or else carboxyl-terminated adducts, for example of trimellitic acid and polyols, for example glycerol or 2,2-bis(4-hydroxycyclohexyl)propane, can be used.

Polyglycidyl ethers or poly(P-methylglycidyl) ethers obtainable by reacting a compound having at least two free alcoholic hydroxyl groups and/or phenolic hydroxyl groups with a suitably substituted epichlorohydrin under alkaline conditions or in the presence of an acidic catalyst followed by alkali treatment can likewise be used. Ethers of this type are derived, for example, from acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. Suitable glycidyl ethers can also be obtained, however, from cycloaliphatic alcohols, such as 1,3- or 1,4-dihydroxycyclohexane, bis(4-hydroxycyclo-hexyl)methane, 2,2-bis(4-hydroxycyclohexyl)propane or 1,1-bis(hydroxymethyl)cyclohex-3-ene, or they possess aromatic rings, such as N,N-bis(2-hydroxyethyl)aniline or p,p'-bis(2-hydroxyethylamino)diphenylmethane.

Particularly important representatives of polyglycidyl ethers or poly(β-methylglycidyl) ethers are based on phenols; either on monocylic phenols, for example on resorcinol or hydroquinone, or on polycyclic phenols, for example on bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolaks and cresol novolaks. These compounds are particularly preferred as epoxy resins for the present invention, especially diglycidyl ethers based on bisphenol A and bisphenol F and mixtures thereof.

Poly(N-glycidyl) compounds are likewise suitable for the purposes of the present invention and are obtainable, for example, by dehydrochlorination of the reaction products of epichlorohydrin with amines containing at least two amine hydrogen atoms. These amines may, for example, be n-butylamine, aniline, toluidine, m-xylylenediamine, bis(4-aminophenyl)methane or bis(4-methylaminophenyl)methane. However, other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Poly(S-glycidyl) compounds are also suitable for component (A) of the novel compositions, examples being di-S-glycidyl derivatives derived from dithiols, for example ethane-1,2-dithiol or bis(4-mercaptomethylphenyl) ether.

Examples of epoxide compounds in which the epoxide groups form part of an alicyclic or heterocyclic ring system include bis(2,3-epoxycyclopentyl) ether, 2,3-epoxycyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexyl-methyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexane-carboxylate, ethanediol di(3,4-epoxycyclohexylmethyl) ether, vinylcyclohexene dioxide, dicyclopentadiene diepoxide or 2-(3,4-epoxycyclohexyl-5,5-spiro-3,4-epoxy)cyclohexane-1,3-dioxane.

However, it is also possible to employ epoxy resins in which the 1,2-epoxide groups are attached to different heteroatoms or functional groups. Examples of these compounds include the N,N,O—triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dim ethyl-1-glycidylhydantoin-3-yl)propane.

Also conceivable is the use of liquid prereacted adducts of epoxy resins, such as those mentioned above, with hardeners for epoxy resins.

It is of course also possible to use liquid mixtures of epoxy resins in the novel compositions.

As component (B) of the novel compositions it is possible to employ a host of known and industrially tried and tested cationic photoinitiators for epoxy resins. Examples of these are onium salts with anions of weak nucleophilicity. Examples thereof are halonium salts, iodosyl salts or sulfonium salts, as are described in EP-A-0 153 904, sulfoxonium salts, as described for example in EP-A-0 035 969, EP-A-0 044 274, EP-A-0 054 509 and in EP-A-0 164 314, or diazonium salts, as described for example in U.S. Pat. No. 3,708,296. Other cationic photoinitiators are metallocene salts, as described for example in EP-A-0 094 914 and in EP-A-0 094 915.

An overview of further commonplace onium salt initiators and/or metallocene salts is offered by "UV-Curing, Science and Technology", (Editor: S. P. Pappas, Technology Marketing Corp., 642 Westover Road, Stanford, Conn., USA) or "Chemistry & Technology of UV & EB Formulations for Coatings, Inks & Paints", Vol. 3 (edited by P. K. T. Oldring).

Preferred compositions are those comprising as component (B) a compound of the formula (B-I), (B-II) or (B-III)

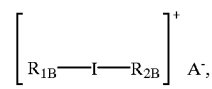

(B-I)

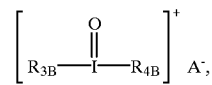

(B-II)

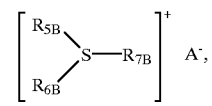

(B-III)

in which $R_{1B}$, $R_{2B}$, $R_{3B}$, $R_{4B}$, $R_{5B}$, $R_{6B}$, and $R_{7B}$ independently of one another are $C_6$–$C_{18}$aryl which is unsubstituted or substituted by appropriate radicals, and $A^-$ is $CF_3SO_3^-$ or an anion of the formula $[LQ_{mB}]^-$, where L is boron, phosphorus, arsenic or antimony,
Q is a halogen atom, or some of the radicals Q in an anion $LQ_m^-$ may also be hydroxyl groups, and
mB is an integer corresponding to the valency of L enlarged by 1.

Examples of $C_6$–$C_{18}$aryl in this context are phenyl, naphthyl, anthryl and phenanthryl. In these substituents present for appropriate radicals are alkyl, preferably $C_1$–$C_6$alkyl, such as methyl, ethyl, n-propyl, isopropyl, n-butyl, sec-butyl, isobutyl, tert-butyl or the various pentyl or hexyl isomers, alkoxy, preferably $C_1$–$C_6$alkoxy, such as methoxy, ethoxy, propoxy, butoxy, pentoxy or hexoxy, alkylthio, preferably $C_1$–$C_6$alkylthio, such as methylthio, ethylthio, propylthio, butylthio, pentylthio or hexylthio, halogen, such as fluorine, chlorine, bromine or iodine, amino groups, cyano groups, nitro groups or arylthio, such as phenylthio. Examples of preferred halogen atoms Q are chlorine and, in particular, fluorine. Preferred anions $LQ_{mB}$ are $BF_4^-$, $PF_6^-$, $AsF_6^-$, $SbF_6^-$ and $SbF_5(OH)^-$.

Particularly preferred compositions are those comprising as component (B) a compound of the formula (B-III), in which $R_{5B}$, $R_{6B}$ and $R_{7B}$ are aryl, aryi being in particular phenyl or biphenyl or mixtures of these two groups.

Further preferred compositions are those comprising as component (B) a compound of the formula (B-IV)

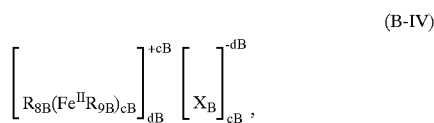

(B-IV)

in which
cB is 1 or 2,
dB is 1, 2, 3, 4 or 5,
$X_B$ is a non-nucleophilic anion, especially $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$ and n-$C_8F_{17}SO_3^-$,
$R_{8B}$ is a π-arene and
$R_{9B}$ is an anion of a π-arene, especially a cyclopentadienyl anion.

Examples of 7u-arenes as $R_{8B}$ and anions of π-arenes as $R_{9B}$ can be found in EP-A-0 094 915. Examples of preferred π-arenes as $R_{8B}$ are toluene, xylene, ethylbenzene, cumene, methoxybenzene, methyinaphthalene, pyrene, perylene, stilbene, diphenylene oxide and diphenylene sulfide. Cumene, methylnaphthalene or stilbene are particularly preferred. Examples of non-nucleophilic anions $X^-$ are $FSO_3^-$, anions of organic sulfonic acids, of carboxylic acids or of anions $LQ_{mB}^-$. Preferred anions are derived from partially fluoro- or perfluoro-aliphatic or partially fluoro- or perfluoro-aromatic carboxylic acids such as $CF_3SO_3^-$, $C_2F_5SO_3^-$, n-$C_3F_7SO_3^-$, n-$C_4F_9SO_3^-$, n-$C_6F_{13}SO_3^-$, n-$C_8F_{17}SO_3^-$, or in particular from partially fluoro- or perfluoro-aliphatic or partially fluoro- or perfluoro-aromatic organic sulfonic acids, for example from $C_6F_5SO_3^-$, or preferably are anions $LQ_{mB}^-$, such as $BF_4^-$, $PF_6^-$, $AsF_6^-$, $SbF_6^-$, and $SbF_5(OH)^-$. Preference is given to $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, n-$C_6F_{13}SO_3^-$, n-$C_8F_{17}SO_3^-$.

The metallocene salts can also be employed in combination with oxidizing agents. Such combinations are described in EP-A-0 126 712.

In order to increase the light yield it is possible, depending on the type of initiator, also to employ sensitizers. Examples of these are polycyclic aromatic hydrocarbons or aromatic keto compounds. Specific examples of preferred sensitizers are mentioned in EP-A-0 153 904.

In the novel compositions it is possible as component (C) to employ all types of photoinitiators which form free radicals given the appropriate irradiation. Typical representatives of free-radical photoinitiators are benzoins, such as benzoin, benzoin ethers, such as benzoin methyl ether, benzoin ethyl ether and benzoin isopropyl ether, benzoin phenyl ether and benzoin acetate, acetophenones, such as acetophenone, 2,2-dimethoxy-acetophenone and 1,1-dichloroacetophenone, benzil, benzil ketals, such as benzil dimethylketal and benzil diethyl ketal, anthraquinones, such as 2-methylanthraquinone, 2-ethylanthra-quinone, 2-tert-butylanthraquinone, 1-chloroanthraquinone and 2-amylanthraquinone, and also triphenylphosphine, benzoylphosphine oxides, for example 2,4,6-trimethylbenzoyl-diphenylphosphine oxide (Luzirin® TPO), bisacylphosphine oxides, benzophenones, such as benzophenone and 4,4'-bis(N,N'-dimethylamino)benzophenone, thioxanthones and xanthones, acridine derivatives, phenazine derivatives, quinoxaline derivatives or 1-phenyl-1,2-propanedione 2—O—benzoyl oxime, 1-aminophenyl ketones or 1-hydroxy phenyl ketones, such as 1-hydroxycyclohexyl phenyl ketone, phenyl 1-hydroxyisopropyl ketone and 4-isopropylphenyl 1-hydroxyisopropyl ketone, all of which constitute known compounds.

Particularly suitable free-radical photoinitiators which are used customarily in combination with an He/Cd laser as light source are acetophenones, such as 2,2-dialkoxybenzophenones and 1-hydroxy phenyl ketones, for example 1-hydroxycyclohexyl phenyl ketone or 2-hydroxy-isopropyl phenyl ketone (=2-hydroxy-2,2-dimethylacetophenone), but especially 1-hydroxy-cyclohexyl phenyl ketone.

A class of photoinitiators (C) which is commonly employed when using argon ion lasers comprises the benzil ketals, for example benzil dimethyl ketal. In particular, the photoinitiator used is an a-hydroxy phenyl ketone, benzil dimethyl ketal or 2,4,6-trimethylbenzoyldiphenyl-phosphine oxide.

A further class of suitable photoinitiators (C) is constituted by the ionic dye-counterion compounds, which are capable of absorbing actinic radiation and of generating free radicals which are able to initiate the polymerization of the acrylates. The novel compositions containing ionic dye-counterion compounds can in this way be cured more variably with visible light in an adjustable wavelength range of 400–700 nm. Ionic dye-counterion compounds and their mode of action are known, for example from EP-A-0 223 587 and U.S. Pat. Nos. 4,751,102, 4,772,530 and 4,772,541. Examples of suitable ionic dye-counterion compounds are the anionic dye-iodonium ion complexes, the anionic dye-pyryllium ion complexes and, in particular, the cationic dye-borate anion compounds of the following formula

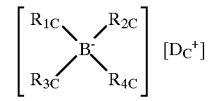

in which $D_c^+$ is a cationic dye and $R_{1C}$, $R_{2C}$, $R_{3C}$ and $R_{4C}$ independently of one another are each an alkyl, aryl, alkaryl, allyl, aralkyl, alkenyl, alkynyl, an alicyclic or saturated or unsaturated heterocyclic group. Preferred definitions for the radicals $R_{1C}$ to $R_{4C}$ can be taken for example, from EP-A-0 223 587.

As photoinitiator (C) the novel compositions preferably include a 1-hydroxy phenyl ketone, especially 1-hydroxycyclohexyl phenyl ketone.

The photoinitiators (B) and (C) are added in effective quantities, i.e. in quantities from 0.1 to 10, particularly from 0.5 to 5 percent by weight, based on the overall quantity of the composition. If the novel compositions are used for stereolithographic processes, in which laser beams are normally employed, it is essential for the absorption capacity of the composition to be matched, by way of the type and concentration of the photoinitiators, in such a way that the depth of curing at normal laser rate is from approximately 0.1 to 2.5 mm. The overall quantity of photoinitiators in the novel compositions is preferably between 0.5 and 6 percent by weight.

The novel mixtures may also contain various photoinitiators of different sensitivity to radiation of emission lines with different wavelengths. What is achieved by this is, for example, a better utilization of a UV/VIS light source which emits emission lines of different wavelengths. In this context it is advantageous for the various photoinitiators to be selected such, and employed in a concentration such, that equal optical absorption is produced with the emission lines used.

The novel compositions preferably comprise component (D) in a quantity of at least 5 percent by weight, in particular at least 10 percent by weight, based on the overall quantity of components (A), (B), (C), (D) and (E).

Component (D) of the novel compositions is preferably from the group consisting of (D1) the dihydroxybenzenes, trihydroxybenzenes and the compounds of the formula (D-I):

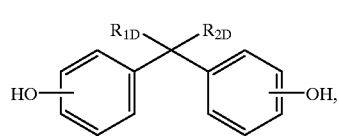

(D-I)

in which $R_{1D}$ and $R_{2D}$ are a hydrogen atom or a methyl group;

(D2) the compounds of the formula (D-II):

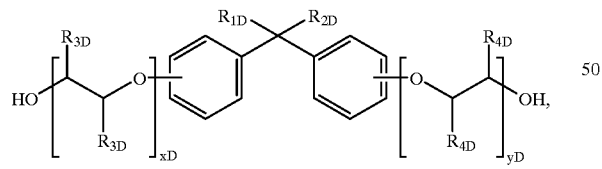

(D-II)

in which $R_{1D}$ and $R_{2D}$ are each a hydrogen atom or a methyl group;

$R_{3D}$ and $R_{4D}$ are all, independently of one another, a hydrogen atom or a methyl group, and xD and yD are each an integer from 1 to 15;

(D3) trimethylolpropane, glycerol, castor oil and the compounds of the formula (D-III) and (D-IV):

(D-III)

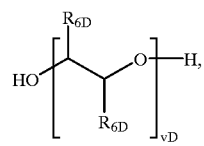

(D-IV)

in which $R_{5D}$ is an unbranched or branched (zD)-valent $C_2$–$C_{20}$alkane residue, preferably a (zD)-valent $C_2$–$C_6$alkane residue, all radicals $R_{6D}$, independently of one another, are a hydrogen atom or a methyl group, zD is an integer from 1 to 4 and vD is an integer from 2 to 20; and also (D4) the compounds of the formulae (D-V), (D-VI), (D-VII), (D-VIII) (D-IX) and (D-X):

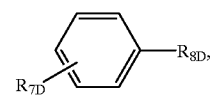

(D-V)

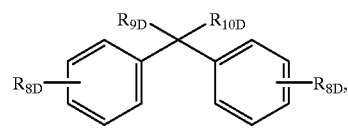

(D-VI)

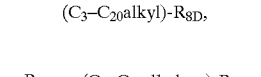

($C_3$–$C_{20}$alkyl)-$R_{8D}$, (D-VII)

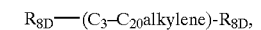

$R_{8D}$—($C_3$–$C_{20}$alkylene)-$R_{8D}$, (D-VIII)

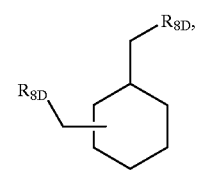

(D-IX)

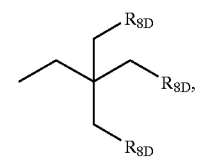

(D-X)

in which $R_{7D}$, $R_{9D}$ and $R_{10D}$ are each a hydrogen atom or a methyl group and each $R_{8D}$ is a group selected from the groups of the formulae (D-XI), (D-XII), (D-XIII) and (D-XIV):

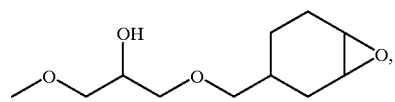

(D-XI)

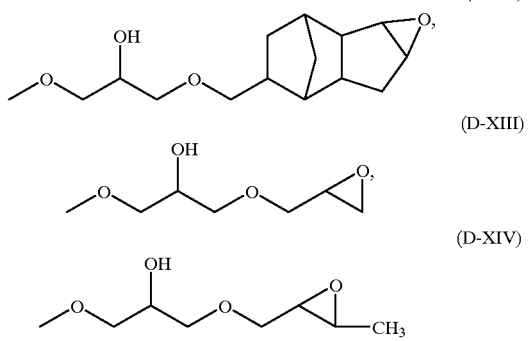

(D-XII)

(D-XIII)

(D-XIV)

The compounds of the above formulae (D-I), (D-II), (D-V), (D-VI) and (D-IX) are preferably the respective 1,4 derivatives or bis-1,4 derivatives.

The compounds of the formulae (D-I) to (D-X) and methods for their preparation are known to the person skilled in the art.

Component (D) of the novel compositions preferably consists of (D2) phenolic compounds having at least 2 hydroxyl groups which are reacted with ethylene oxide, propylene oxide or with ethylene oxide and propylene oxide, and especially of the compounds of the formula (D-IIa):

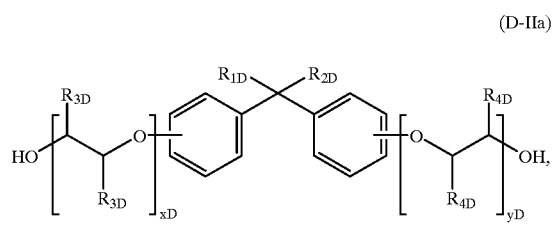

(D-IIa)

in which $R_{1D}$ and $R_{2D}$ are both a hydrogen atom or both a methyl group;

$R_{3D}$ and $R_{4D}$ are all, independently of one another, each a hydrogen atom or a methyl group, and xD and yD are each an integer from 1 to 15.

The liquid poly(meth)acrylates having a (meth)acrylate functionality of more than two which are used in the novel compositions as component (E) may, for example, be tri-, tetra- or pentafunctional monomeric or oligomeric aliphatic, cycloaliphatic or aromatic acrylates or methacrylates. The compounds preferably have a molecular weight of from 200 to 500.

Examples of suitable aliphatic polyfunctional (meth) acrylates are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate, bistrimethylolpropane tetraacrylate, pentaerythritol monohydroxytriacrylate or -methacrylate, or dipentaerythritol monohydroxypentaacrylate or -methacrylate.

It is additionally possible, for example, to use polyfunctional urethane acrylates or urethane methacrylates. These urethane (meth)acrylates are known to the person skilled in the art and can be prepared in a known manner by, for example, reacting a hydroxyl-terminated polyurethane with acrylic acid or methacrylic acid, or by reacting an isocyanate-terminated prepolymer with hydroxyalkyl (meth)acrylates to give the urethane (meth)acrylate.

Examples of suitable aromatic tri(meth)acrylates are the reaction products of triglycidyl ethers of trihydric phenols and phenol or cresol novolaks containing three hydroxyl groups, with (meth)acrylic acid.

The (meth)acrylates employed as component (E) are known compounds and some are commercially available, for example from the SARTOMER Company under product designations such as SR®295, SR®350, SR®351, SR®367, SR®399, SR®444, SR®454 or SR®9041.

Preferred compositions are those in which component (E) is a tri(meth)acrylate or a penta(meth)acrylate.

Suitable examples of the di(meth)acrylate component (F) are the di(meth)acrylates of cycloaliphatic or aromatic diols such as 1,4-dihydroxymethylcyclohexane, 2,2-bis(4-hydroxy-cyclohexyl)propane, bis(4-hydroxycyclohexyl) methane, hydroquinone, 4,4'-dihydroxybi-phenyl, bisphenol A, bisphenol F, bisphenol S, ethoxylated or propoxylated bisphenol A, ethoxylated or propoxylated bisphenol F or ethoxylated or propoxylated bisphenol S. Di(meth)acrylates of this kind are known and some are commercially available.

Other di(meth)acrylates which can be employed are compounds of the formulae (F-I), (F-II), (F-III) or (F-IV)

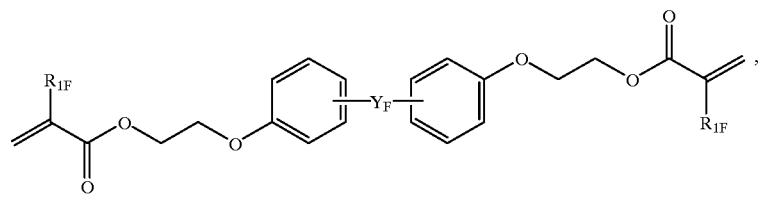

(F-I)

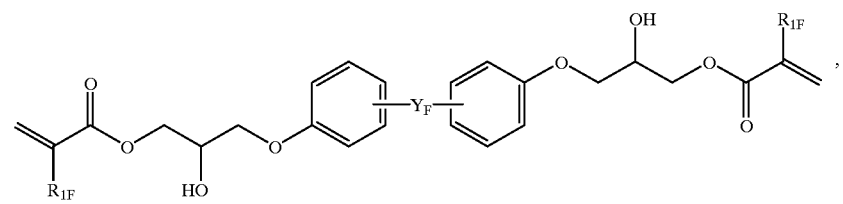

(F-II)

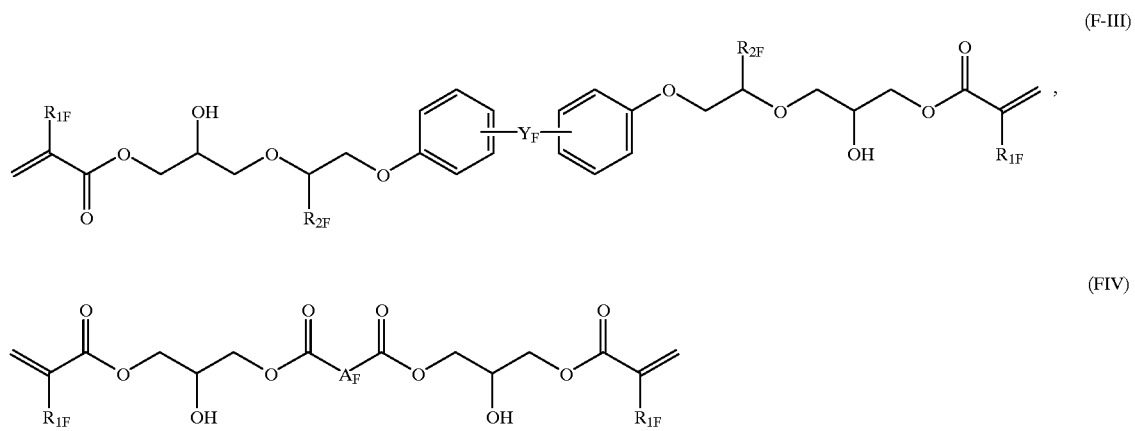

(F-III)

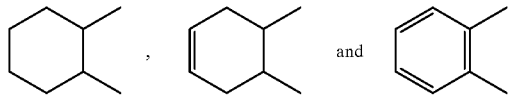

(F-IV)

in which $R_{1F}$ is a hydrogen atom or methyl, $Y_F$ is a direct bond, $C_1$–$C_6$alkylene, —S—, —O—, —SO—, —SO$_2$— or —CO—, $R_{2F}$ is a $C_1$–$C_8$alkyl group, a phenyl group which is unsubstituted or substituted by one or more $C_1$–$C_4$alkyl groups, hydroxyl groups or halogen atoms, or is a radical of the formula —CH$_2$—OR$_{3F}$ in which $R_{3F}$ is a $C_1$–$C_8$alkyl group or phenyl group, and AF is a radical selected from the radicals of the formulae

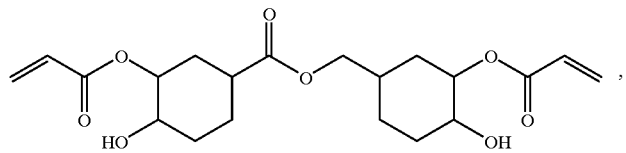

Further examples of possible di(meth)acrylates are compounds of the formulae (F-V), (F-VI), (F-VII) and (F-VIII)

(F-V)

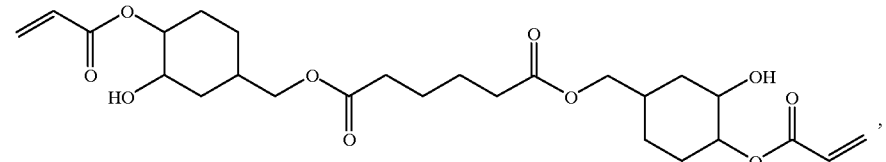

(F-VI)

(F-VII)

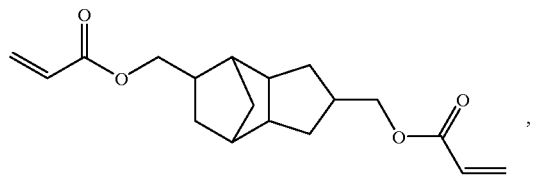

(F-VIII)

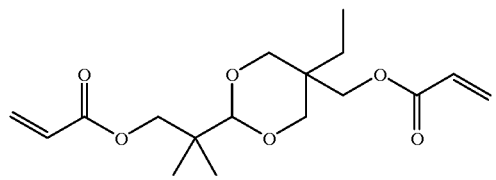

These compounds of the formulae (F-I) to (F-VIII) are known and some are commercially available. Their preparation is also described in EP-A-0 646 580.

In many cases it is also expedient to add further constituents to the novel compositions, examples being customary additives, such as reactive diluents, for example propylene carbonate, propylene carbonate propenyl ether or lactones, stabilizers, for example, UV stabilizers, polymerization inhibitors, release agents, wetting agents, levelling agents, sensitizers, antisettling agents, surface-active agents, dyes, pigments or fillers. Each of these is employed in a quantity effective for the desired purpose, and together they make up preferably up to 20 percent by weight of the novel compositions. Fillers in particular, however, may also be sensibly employed in greater quantities, for example in quantities of up to 75 percent by weight.

Particularly preferred novel compositions are those in which both component (A) and component (D) comprise substances having aromatic carbon rings in their molecule. In such compositions, component (A) preferably contains one or more aromatic glycidyl ethers, especially diglycidyl ethers based on bisphenols, especially based on bisphenol A, bisphenol F, and mixtures of such diglycidyl ethers.

Particularly good properties are had by novel compositions comprising:
(A1) from 20 to 60 percent by weight of an aromatic difunctional or more highly functional polyglycidyl ether or of a liquid mixture consisting of aromatic difunctional or more highly functional polyglycidyl ethers;
(A2) from 0 to 50 percent by weight of an aliphatic or cycloaliphatic difunctional or more highly functional glycidyl ether;
(B) from 0.1 to 10 percent by weight of a cationic photoinitiator or of a mixture of cationic photoinitiators; and
(C) from 0.1 to 10 percent by weight of a free-radical photoinitiator or of a mixture of free-radical photoinitiators;
(D) from 5 to 40 percent by weight of a phenolic compound having at least 2 hydroxyl groups and/or of a phenolic compound having at least 2 hydroxyl groups which is reacted with ethylene oxide, propylene oxide or with ethylene oxide and propylene oxide;
(E) from 4 to 30 percent by weight of at least one liquid poly(meth)acrylate having a (meth)acrylate functionality of more than 2,
(F) from 0 to 20 percent by weight of one or more di(meth)acrylates and
(G) from 0 to 10 percent by weight of a reactive diluent.

A further particularly preferred composition according to the invention comprises:
(A) from 40 to 80 percent by weight of an aliphatic and/or cycloaliphatic difunctional or more highly functional glycidyl ether or of a mixture of such resins;
(B) 2 to 5 percent by weight of a cationic photoinitiator or of a mixture of cationic photoinitiators, particularly of a sulfonium type photoinitiator;
(C) 0.5 to 2 percent by weight of a free-radical photoinitiator or of a mixture of free-radical photoinitiators, particularly of a 1-hydroxy phenyl ketone;
(D) from 10 to 20 percent by weight of a phenolic compound having at least 2 hydroxyl groups which is reacted with ethylene oxide, with propylene oxide or with ethylene oxide and propylene oxide;
(E) from 4 to 10 percent by weight of at least one liquid poly(meth)acrylate having a (meth)acrylate functionality of more than 2, and
(F) from 4 to 10 percent by weight of one or more di(meth)acrylates.

The novel compositions can be prepared in a known manner by, for example, premixing individual components and then mixing these premixes, or by mixing all of the components using customary devices, such as stirred vessels, in the absence of light and, if desired, at slightly elevated temperature.

The novel compositions can be polymerized by irradiation with actinic light, for example by means of electron beams, X-rays, UV or VIS light, preferably with radiation in the wavelength range of 280–650 nm. Particularly suitable are laser beams of HeCd, argon or nitrogen and also metal vapour and NdYAG lasers. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic particles and which enable the greatest depth of penetration of the radiation into the compositions which are to be polymerized.

The invention additionally relates to a method of producing a cured product, in which compositions as described above are treated with actinic radiation. For example, it is possible in this context to use the novel compositions as adhesives, as coating compositions, as photoresists, for example as solder resists, or for rapid prototyping, but especially for stereolithography. When the novel mixtures are employed as coating compositions, the resulting coatings on wood, paper, metal, ceramic or other surfaces are clear and hard. The coating thickness may vary greatly and can for instance be from 0.01 mm to about 1 mm. Using the novel mixtures it is possible to produce relief images for printed circuits or printing plates directly by irradiation of the mixtures, for example by means of a computer-controlled laser beam of appropriate wavelength or employing a photomask and an appropriate light source.

One specific embodiment of the abovementioned method is a process for the stereolithographic production of a three-dimensional shaped article, in which the article is built up from a novel composition with the aid of a repeating, alternating sequence of steps (a) and (b); in step (a), a layer of the composition, one boundary of which is the surface of the composition, is cured with the aid of appropriate radiation within a surface region which corresponds to the desired cross-sectional area of the three-dimensional article to be formed, at the height of this layer, and in step (b) the freshly cured layer is covered with a new layer of the liquid, radiation-curable composition, this sequence of steps (a) and (b) being repeated until an article having the desired shape is formed. In this process, the radiation source used is preferably a laser beam, which with particular preference is computer-controlled.

In general, the above-described initial radiation curing, in the course of which the so-called green models are obtained which do not as yet exhibit adequate strength, is followed then by the final curing of the shaped articles by heating and/or further irradiation.

The term "liquid" in this application is to be equated with "liquid at room temperature" in the absence of any statement to the contrary, room temperature being understood as being, in general, a temperature between 5° and 40° C., preferably between 10° and 30° C.

EXAMPLES

The trade names of the components as indicated in the examples below correspond to the chemical substances as defined in the following table.

| Trade name | Chemical designation |
|---|---|
| Araldit GY 250 | bisphenol A diglycidyl ether |
| Araldit PY 306 | bisphenol F diglycidyl ether |
| Araldit CY 179 | 3,4-epoxycyclohexylmethyl 3',4'-epoxycyclohexanecarboxylate |
| Araldit DY 026 | butanediol diglycidyl ether |
| Araldit DY 0395 | trimethylolpropane triglycidyl ether |
| Araldit DY 0396 | cyclohexanedimethanol diglycidyl ether |
| Cyracure UVI 6974 | mixture of $(C_6H_5)S(C_6H_4)$—$S^+(C_6H_5)_2SbF_6^-$ and $F_6Sb^-(C_6H_5)_2S^+$—$(C_6H_4)S(C_6H_4)$—$S^+(C_6H_5)_2SbF_6$ |
| Irgacure 184 | 1-hydroxycyclohexyl phenyl ketone |
| Dianol 320 | propoxylated bisphenol A |
| Dianol 2211 | ethoxylated bisphenol A |
| Sartomer SR 399 | dipentaerythritol monohydroxypentaacrylate |
| Sartomer SR 9041 | |
| Novacure 3700 | bisphenol A diglycidyl ether diacrylate |
| Sartomer SR 348 | dimethacrylate of ethoxylated bisphenol A |
| Pleximon V 773 | neopentylglycol dimethacrylate |
| Sartomer SR 238 | hexanediol diacrylate |

The formulations indicated in the examples are prepared by mixing the components, with a stirrer at 60° C., until a homogeneous composition is obtained. The physical data relating to the formulations are obtained as follows:

The viscosity of the liquid mixture is determined at 30° C. using a Brookfield viscometer.

The mechanical properties of the formulations are determined on three-dimensional specimens produced with the aid of an He/Cd or Ar/UV laser.

The photosensitivity of the formulations is determined on so-called window panes. In this determination, single-layer test specimens are produced using different laser energies, and the layer thicknesses obtained are measured. The plotting of the resulting layer thickness on a graph against the logarithm of the irradiation energy used gives a "working curve". The slope of this curve is termed Dp (given in mm or mils). The energy value at which the curve passes through the x-axis is termed Ec (and is the energy at which gelling of the material still just takes place; cf. P. Jacobs, Rapid Prototyping and Manufacturing, Soc. of Manufacturing Engineers, 1992, p. 270 ff.).

The green strength is determined by measuring the flexural modulus 10 minutes and 1 hour after production of the test specimen (ASTM D 790). The flexural modulus after curing is determined after the test specimen has been cured in UV light for 1 hour.

The curl factor (CF) is used in stereolithography in order to compare the shrinkage properties of different formulations (cf. P. Jacobs, Rapid Prototyping and Manufacturing, Soc. of Manufacturing Engineers, 1992, p. 256 ff.). The curl factors (in %) given in this application are determined on test specimens produced using the "ACES" structural design (cf. P. Jacobs, Stereolithography and other RP&M Technologies, Soc. of Manufacturing Engineers, 1996, p.156 ff.) and with a layer thickness of 0.15 mm (6 mils).

To determine the water uptake, test specimens are produced using the "quick cast" structural design (cf. P. Jacobs, Stereolithography and other RP&M Technologies, 1996, p. 183 ff.) and after complete curing (60 minutes under UV light, 30 minutes at 100° C.) are dried to constant weight in a desiccator. The samples are then stored at 62 and 88% atmospheric humidity. The water uptake is determined by weighing the samples at regular intervals until constant weight is reached, which is generally the case after no more than 7–14 days. In these examples, the water uptake after 14 days is given.

Example 1 a) The following components are used as indicated above to produce a homogeneous liquid composition:

14.6 g of Araldit DY 0395
42.5 g of Araldit CY 179
6.0 g of Novacure 3700
6.0 g of Sartomer 399
24.9 g of Dianol 320
2.0 g of Irgacure 184
4.0 g of Cyracure UVI 6974

The viscosity of this mixture is 800 mPa s (cps) at 30° C.

The slope of the "working curve" is 0.124 mm (4.9 mils); the critical energy Ec is 12.5 J/cm$^2$.

The flexural modulus of the green model one hour after production in the stereolithography unit is 61 MPa, and after complete curing is 2360 MPa.

The curl factor is 8.5%.

The water uptake of a quick-cast test specimen after 14 days at 62% rel. atmospheric humidity is 2.1% and is 4.4% after 14 days at 88% atmospheric humidity.

b) A composition comprising the following components:

20.0 g of Araldit DY 0395
15.0 g of Araldit DY 0396
34.0 g of Araldit CY 179
6.0 g of Bisphenol A diglycidyl diacrylate
6.0 g of Sartomer 9041
13.5 g of Dianol 320
1.5 g of Irgacure 184
4.0 g of Cyracure UVI 6974 shows properties comparable to those found for the composition described under a).

Examples 2–8

The mixtures are prepared as described above. Their compositions and physical properties can be taken from the table below.

| Component | | Ex. 2 | Ex. 3 | Ex. 4 | Ex. 5 | Ex. 6 | Ex. 7 | Ex. 8 |
|---|---|---|---|---|---|---|---|---|
| Araldit GY 250 | (A) | | | | | 22 | 22 | 22 |
| Araldit PY 306 | (A) | | | | | 23 | 25 | 20 |
| Araldit CY 179 | (A) | 42.5 | 48 | 65 | 65 | | | |
| Araldit DY 026 | (A) | 14.6 | | | | | | |
| Araldit DY 0395 | (A) | | 17.5 | | | | | |
| Araldit DY 0396 | (A) | | | | | 10 | 5 | 10 |
| Cyracure UVI 6974 | (B) | 4 | 3 | 0.5 | 0.5 | 4 | 4 | 4 |
| Irgacure 184 | (C) | 2 | 0.5 | 2.5 | 2.5 | 1 | 1 | 1 |
| Bisphenol A | (D) | | | | 20 | | | |
| Dianol 320 | (D) | 24.9 | 18.9 | | | 10 | 10 | 15 |
| Dianol 2211 | (D) | | | 20 | | | | |
| Sartomer SR 399 | (E) | 6 | 6 | 6 | 6 | 10 | 10 | 10 |
| Novacure 3700 | (F) | 6 | 6 | 6 | 6 | | | |
| Sartomer SR 348 | (F) | | | | | 10 | 10 | 10 |
| Pleximon V 773 | (F) | | | | | 10 | | |
| Sartomer SR 238 | (F) | | | | | | 8 | 8 |
| pyrene | additive | | 0.1 | | | | | |
| propylenecarbonate | additive | | | | | | 5 | |
| viscosity (30° C.) [mPa s (cps)] | | 431 | 563 | 755 | 3350 | 516 | 346 | 581 |
| laser used | | Ar/UV | Ar/UV | HeCd | HeCd | Ar/UV | Ar/UV | Ar/UV |
| Dp [mm (converted from the indication in mils)] | | 0.120 | 0.132 | 0.128 | 0.112 | 0.121 | 0.100 | 0.134 |
| Ec [mJ/cm$^2$] | | 12.2 | 29.39 | 15.93 | 18.02 | 34.94 | 25.82 | 38.3 |
| Flex. modulus of the green model after 10 min [MPa] | | 0 | 86 | 247 | 90 | 395 | 300 | 663 |
| Flex. modulus of the green model after 60 min [MPa] | | 177 | 348 | | | 1024 | 993 | 1087 |
| Flex. modulus of the test specimen after 60 min UV [MPa] | | 2370 | 1621 | | | 2118 | 2216 | 3141 |
| curl factor 6 ACES [%] | | 7 | 8.8 | 7.5 | 12 | 7.7 | 11.5 | 17 |
| Water uptake [%], quick-cast strips (cured: 1 h, UV + 30 min/100° C.), 14 d at 62% atmospheric humidity | | 2.1 | 2.1 | 2.3 | | 1.2 | 1.2 | 1.2 |
| Water uptake [%], quick-cast strips (cured: 1 h, UV + 30 min/100° C.), 14 d at 88% atmospheric humidity | | 4.3 | 3.9 | 4.7 | | 2.2 | 2.2 | 2.2 |

Example 9–11

These examples show how components of type (D4) having OH groups and epoxy groups can be prepared.

Example 9: Preparation of a compound of the formula

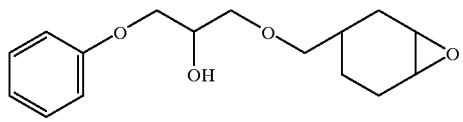

56.06 g (0.5 mol) of tetrahydrobenzyl alcohol are heated with 0.24 g of boron trifluoride ethyl etherate to 60° C. Then 75.09 g (0.5 mol) of phenyl glycidyl ether are added dropwise, the temperature being maintained at 60° C. using an ice bath. Stirring is continued for about 2 hours. Then 6.6 g of Florisil (magnesium silicate, adsorbent) are added, and the mixture is filtered while still hot. 100 g (0.38 mol) of the resulting product are dissolved in 240 ml of chloroform. Then 196 g of 8% hydrogen peroxide (0.46 mol), 3 g of Aliquat 336 (tricaprylmethylammonium chloride), 6.2 g of sodium tungstate dihydrate and 3.8 g of phosphoric acid are added. The mixture is refluxed with stirring. After about 1 hour the mixture is cooled and the organic phase is isolated, washed with water and dried. Evaporation of the solvent gives 85.65 g (81%) of a viscous yellow liquid having an epoxide content of 3.59 eq/kg (65% of theory).

Example 10: Preparation of a compound of the formula

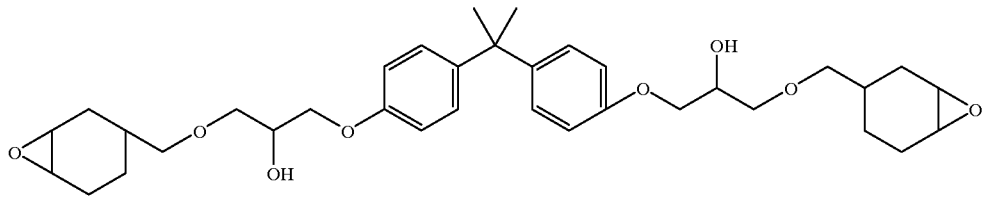

250 g (2.23 mol) of tetrahydrobenzyl alcohol are heated with 1.2 g of boron trifluoride ethyl etherate to 60° C. Then 415.46 g (1.12 mol) of bisphenol A diglycidyl ether (Araldit GY 250) are added dropwise, the temperature being maintained at about 60° C. After the end of the addition, 33.3 g of Florisil are added, and the mixture is diluted with chloroform and filtered. The organic phase is washed twice with water and dried and the solvent is stripped off on a rotary evaporator. 73.42 g (0.13 mol) of the resulting product are dissolved in 150 ml of chloroform. Then 131.8 g (0.31 mol) of 8% hydrogen peroxide, 1.17 g of Aliquat 336, 2.13 g of sodium tungstate dihydrate and 1.27 g of phosphoric acid are added. The mixture is refluxed with stirring for about 6 hours. Then the organic phase is separated off, washed with water and dried and the solvent is stripped off on a rotary evaporator. Yield: 64.9 g (83.6%), epoxide content 2.1 eq/kg (63.4% of theory)

Example 11: Preparation of a compound of the formula

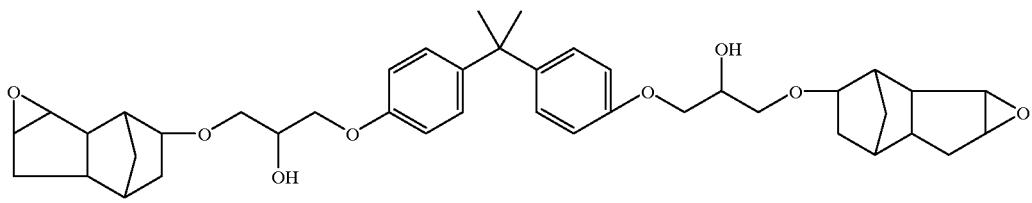

87.13 g (0.58 mol) of TCD Alkohol E* (Hoechst, unsaturated tricyclohexyl alcohol) are heated with 0.34 g of boron trifluoride ethyl etherate to 60° C. Then 100 g (0.29 mol) of bisphenol A diglycidyl ether (Araldit GY 250) are added dropwise, the temperature being maintained at 60° C. After the end of the addition, the mixture is stirred for about 2 hours more. Then 9.4 g of Florisil are added, and the mixture is diluted with chloroform and filtered. The organic phase is washed and dried, and the solvent is stripped off on a rotary evaporator. 185 g (0.29 mol) of the resulting product are dissolved in 300 ml of chloroform. Then 295.9 g (0.7 mol) of 8% hydrogen peroxide, 2.62 g of Aliquat 336, 4.75 g of sodium tungstate hydrate and 2.84 g of phosphoric acid are added. The mixture is stirred at 60° C. for about 5 hours. The organic phase is then separated off, washed with water and dried, and the solvent is stripped off on a rotary evaporator.

Yield: 194.2 g (99%), epoxide content 2.35 eq/kg (79.3% of theory).

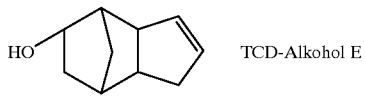
TCD-Alkohol E

Examples 12–15

The mixtures are prepared as described above. Their compositions and physical properties are shown in the table below.

What is claimed is:

1. A liquid, radiation-curable composition which in addition to a liquid, free-radically polymerizable component comprises at least the following additional components:

(A) from 40 to 80 percent by weight of a liquid epoxy resin having two or more then two epoxy groups per molecule or of a liquid mixture consisting of epoxy resins having two or more than two epoxy resins per molecule;

(B) from 0.1 to 10 percent by weight of a cationic photoinitiator or of a mixture of cationic photoinitiators; and (C) from 0.1 to 10 percent by weight of a free-radical photoinitiator or of a mixture of free-radical photoinitiators; and (D) up to 40 percent by weight of a hydroxy compound, in which composition component (D) is selected from the group consisting of:

(D1) a phenolic compound having at least 2 hydroxyl groups selected from the group consisting of the dihydroxybenzenes, trihydroxybenzenes and the compounds of the formula (D-I):

| Component | | Ex. 12 | Ex. 13 | Ex. 14 | Ex. 15 |
|---|---|---|---|---|---|
| Araldit GY 250 | (A) | 20 | 48 | 25 | 26 |
| Araldit PY 306 | (A) | 22 | | 25 | 26 |
| Araldit DY 0395 | (A) | 15 | 20 | 15 | 15 |
| Cyracure UVI 6974 | (B) | 4 | 1 | 4 | 4 |
| Irgacure 184 | (C) | 1 | 1 | 1 | 1 |
| Dianol 320 | (D) | 10 | | | |
| Castor oil | (D) | | 10 | 10 | |
| 1,6-Hexanediol | (D) | | | | 8 |
| Compound of Ex. 9 | (D) | 8 | | | |
| Sartomer SR 399 | (E) | 10 | 10 | 10 | |
| Novacure 3700 | (F) | 10 | 10 | 10 | 10 |
| viscosity (30° C.) [mPa s (cps)] | | 5810 | 1030 | 3770 | 1210 |
| laser used | | Ar/UV | He/Cd | Ar/UV | Ar/UV |
| Dp [mm (converted from the indication in mils)] | | 3.73 | 3.49 | 4.37 | 3.78 |
| Ec [mJ/cm$^2$] | | 25.91 | 19.23 | 30.33 | 16.7 |
| Flex. modulus of the green model after 10 min [MPa] | | | 0 | 200 | |
| Flex. modulus of the green model after 60 min [MPa] | | | 110 | 394 | |
| Flex. modulus of the test specimen after 60 min UV [MPa] | | 626 | 955 | 2159 | 1917 |
| curl factor 6 ACES [%] | | 4.5 | 18 | 9.8 | 20.8 |
| Water uptake [%], quick-cast strips (cured: 1 h, UV + 30 min/100° C.), 14 d at 62% atmospheric humidity | | 1.4 | 1 | 1.1 | 1.6 |
| Water uptake [%], quick-cast strips (cured: 1 h, UV + 30 min/100° C.), 14 d at 88% atmospheric humidity | | 2.8 | 1.6 | 2.1 | 3 |

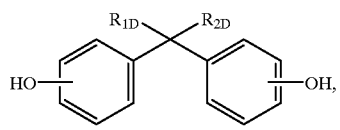
(D-I)

in which $R_{1D}$ and $R_{2D}$ are a hydrogen atom or a methyl group;

(D2) a phenolic compound having at least 2 hydroxyl groups, which have been reacted with ethylene oxide, proplyene oxide or with ethylene oxide and propylene oxide, which phenolic compound is selected from the group consisting of the compounds of the formula (D-II):

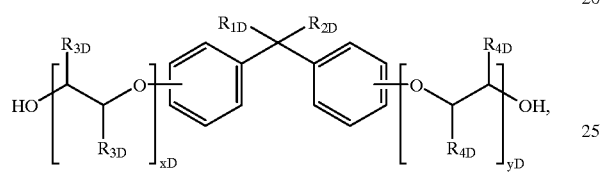
(D-II)

in which $R_{1D}$ and $R_{2D}$ are each a hydrogen atom or a methyl group;

$R_{3D}$ and $R_{4D}$ are all, independently of one another, a hydrogen atom or a methyl group, and xD and yD are each an integer from 1 to 15;

(D3) an aliphatic hydroxy compound having not more than 80 carbon atoms selected from the group consisting of trimethylolpropane, glycerol, castor oil and the compounds of the formula (D-III) and (D-IV):

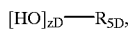
(D-III)

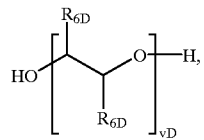
(D-IV)

in which $R_{5D}$ is an unbranched or branched (zD)-vatent $C_2$–$C_{20}$ alkane residue, all radicals $R_{6D}$, independently of one another, are a hydrogen atom or a methyl group, zD is an integer from 1 to 4 and vD is an integer from 2 to 20;

(D4) a compound having at least one hydroxyl group and at least one epoxide group which is selected from the group consisting of the compounds of the formulae (D-V), (D-VI), (D-VII), (D-VIII) (D-IX) and (D-X):

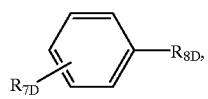
(D-V)

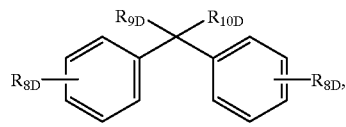
(D-VI)

(D-VII)

(D-VIII)

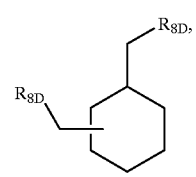
(D-IX)

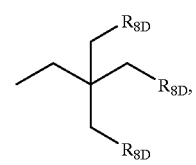
(D-X)

in which $R_{7D}$, $R_{9D}$ and $R_{10D}$ are each a hydrogen atom or a methyl group and each $R_{8D}$ is a group selected from the groups of the formulae (D-XI), (D-XII), (D-XIII) and (D-XIV):

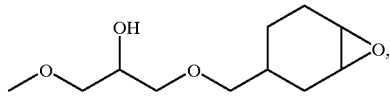
(D-XI)

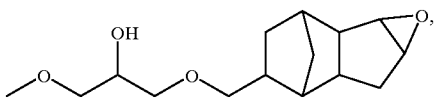
(D-XII)

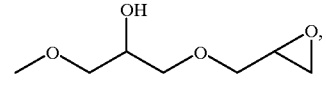
(D-XIII)

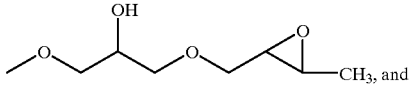
(D-XIV)

(D5) a mixture of at least 2 of the compounds mentioned under (D1) to (D4), wherein component (D) is present in the composition in a quantity of at least 2 percent by weight; the free-radically polymerizable component comprises at least (E) from 4 to 30 percent by weight of at least one liquid poly(meth)acrylate having a (meth)acrylate functionality of more than 2; and at least one of components (A) and (D) comprises a substance which has aromatic carbon rings in its molecule.

2. A composition according to claim 1, which contains at least 5 percent by weight of component (D).

3. Composition according to claim 1, in which component (D) consists of (D2) phenolic compounds having at least 2 hydroxyl groups which are reacted with ethylene oxide, propylene oxide or with ethylene oxide and propylene oxide.

4. Composition according to claim 3, in which component (D) consists of (D2) the compounds of the formula (D-IIa)

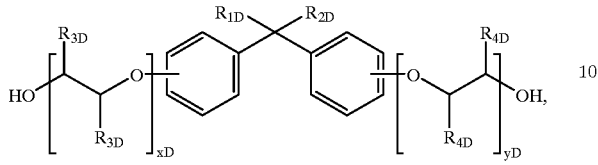

(D-IIa)

in which $R_{1D}$ and $R_{2D}$ are both a hydrogen atom or a methyl group;

$R_{3D}$ and $R_{4D}$ are all, independently of one another, a hydrogen atom or a methyl group, and xD and yD are each an integer from 1 to 15.

5. A composition according to claim 1, which as an additional component (F) contains one or more di(meth)acrylates.

6. A composition according to claim 5, which contains component (F) in a quantity of from 5 to 40 percent by weight.

7. A composition according to claim 1, in which both component (A) and component (D) comprise substances having aromatic carbon rings in their molecule.

8. A composition according to claim 1, comprising (A1) from 20 to 60 percent by weight of an aromatic polyglycidyl ether having two or more than two glycidylether groups per molecule or of a liquid mixture consisting of aromatic polyglycidyl ethers having two or more than two alycidylether groups per molecule;

(A2) from 0 to 50 percent by weight of an aliphatic or cycloaliphatic glycidyl ether;

(B) from 0.1 to 10 percent by weight of a cationic photoinitiator or of a mixture of cationic photoinitiators; and (C) from 0.1 to 10 percent by weight of a free-radical photoinitiator or of a mixture of freeradical photoinitiators;

(D) from 5 to 40 percent by weight of a phenolic compound having at least 2 hydroxyl groups and/or of a phenolic compound having at least 2 hydroxyl groups which is reacted with ethylene oxide, propylene oxide or with ethylene oxide and propylene oxide;

(E) from 4 to 30 percent by weight of at least one liquid poly(meth)acrylate having a (meth)acrylate functionality of more than 2, (F) from 0 to 20 percent by weight of one or more di(meth)acrylates and (G) from 0 to 10 percent by weight of a reactive diluent.

9. A composition according to claim 1, comprising:

(A) from 40 to 80 percent by weight of an aliphatic and/or cycloaliphatic glycidyl ether having two or more than two glycidylether groups per molecule or of a mixture of such resins;

(B) 2 to 5 percent by weight of a cationic photoinitiator or of a mixture of catonic photoinitiators;

(C) 0.5 to 2 percent by weight of a free-radical photoinitiator or of a mixture of free-radical photoinitiators;

(D) from 10 to 20 percent by weight of a phenolic compound having at least 2 hydroxyl groups which is reacted with ethylene oxide, with propylene oxide or with ethylene oxide and propylene oxide;

(E) from 4 to 10 percent by weight of at least one liquid poly(meth)acrylate having a (methyacrylate functionality of more than 2, and (F) from 4 to 10 percent by weight of one or more di(meth)acrylates.

10. A composition according to claim 9 wherein component (B) is a sulfonium cationic photoinitiator.

11. A composition according to claim 9 wherein component (C) is a 1-hydroxy phenyl ketone free radical photoinitiator.

12. A method of producing a cured product, in which a composition according to claim 1 is treated with actinic radiation.

13. A method according to claim 12, in which the cured product produced is a three-dimensional shaped article and in which the article is built up from said composition with the aid of a repeating, alternating sequence of steps (a) and (b); in step (a), a layer of the composition, one boundary of which is the surface of the composition, is cured with the aid of appropriate radiation within a surface region which corresponds to the desired cross-sectional area of the three-dimensional article to be formed, at the height of this layer, and in step (b) the freshly cured layer is covered with a new layer of the radiation-curable, liquid composition, this sequence of steps (a) and (b) being repeated until an article having the desired shape is formed and this article is, if desired, subjected to post-curing.

* * * * *

UNITED STATES PATENT AND TRADEMARK OFFICE
CERTIFICATE OF CORRECTION

PATENT NO. : 5,972,563
DATED : OCTOBER 26, 1999
INVENTOR(S) : BETTINA STEINMANN ET AL.

It is certified that error appears in the above-identified patent and that said Letters Patent is hereby corrected as shown below:

On the cover page, item [30] should read:

-- [30]     Foreign Application Priority Data

July 29, 1996  [CH]  Switzerland    1885/96
    Sept. 5, 1996  [CH]  Switzerland    2201/96 --.

Signed and Sealed this

Twenty-fifth Day of April, 2000

Attest:

Q. TODD DICKINSON

*Attesting Officer*       *Director of Patents and Trademarks*